Figure 1:
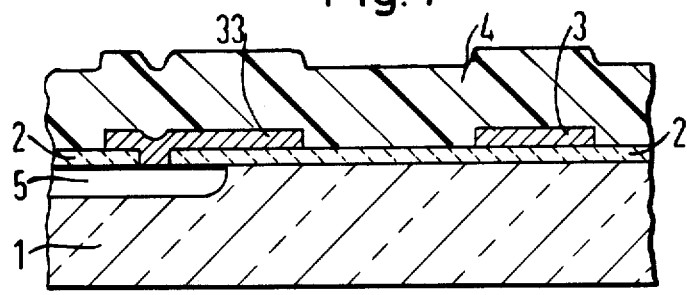

United States Patent [19]

Sigusch et al.

[11] 3,953,877
[45] Apr. 27, 1976

[54] SEMICONDUCTORS COVERED BY A POLYMERIC HEAT RESISTANT RELIEF STRUCTURE

[75] Inventors: Reiner Sigusch, Munich; Dietrich Widmann, Unterhaching, both of Germany

[73] Assignee: Siemens Aktiengesellschaft, Munich, Germany

[22] Filed: May 21, 1974

[21] Appl. No.: 471,952

[30] Foreign Application Priority Data

May 23, 1973  Germany............................ 2326314

[52] U.S. Cl............................. 357/72; 96/35.1; 96/115 R
[51] Int. Cl.²......................................... H01L 23/28
[58] Field of Search ................ 357/72; 96/115, 35.1

[56] References Cited
UNITED STATES PATENTS

| | | | |
|---|---|---|---|
| 3,179,634 | 4/1965 | Edwards | 357/72 |
| 3,249,829 | 5/1966 | Everett et al. | 357/72 |
| 3,332,912 | 7/1967 | Rochlitz | 357/72 |
| 3,405,224 | 10/1968 | Yawata et al. | 357/72 |
| 3,495,996 | 2/1970 | Delaney et al. | 357/72 |
| 3,653,959 | 4/1972 | Kehr | 357/72 |
| 3,655,543 | 4/1972 | Dijkstra | 357/72 |
| 3,684,592 | 8/1972 | Chang et al. | 357/72 |
| 3,694,707 | 9/1972 | Nakamura et al. | 357/72 |
| 3,700,497 | 10/1972 | Epifano et al. | 357/72 |

*Primary Examiner*—Andrew J. James
*Attorney, Agent, or Firm*—Kenyon & Kenyon Reilly Carr & Chapin

[57] ABSTRACT

Described are novel semiconductor structures having a protective passivating layer made from photo- or radiation cross-linking of selected reactive sites of a soluble pre-polymer which is a poly-addition or polycondensation product of a polyfunctional carbocyclic and/or heterocyclic compound having reactive groups for condensation or addition as well as photoreactive or radiation-reactive groups capable of further polymerization or dimerization. Selected non-cross-linked portions of the passivating layer may be removed by dissolution to form contact points for various useful semiconductor and capacitor components.

7 Claims, 8 Drawing Figures

SEMICONDUCTORS COVERED BY A POLYMERIC HEAT RESISTANT RELIEF STRUCTURE

INTRODUCTION

This invention relates to a new and useful semiconductor components with relief structures.

It is standard practice to cover semiconductor components arranged on semiconductor discs with a protective layer before the semiconductor discs are cut up into individual chips. The object of the protective layer is to protect the conductor tracks on the surface of the semiconductor. The protective layer is also intended to protect the semiconductor components on the semiconductor disc against moisture and harmful substances, especially sodium ions, in operation.

It is also known that hardened polyimide resin layers can be used as protective layers. For example, German Patent No. 1,764,977 describes a certain process for the production of a semiconductor component with a protective layer consisting of a cured polyimide. According to this process, the protective layer has to be coated with a layer of photoresist and exposed through a mask in order to form contact openings. The mask determines the position of the contact openings to be formed in the protective layer. After exposure, parts of the photoresist layer and of the underlying protective layer are removed at the appropriate places in order to form these openings.

A principal object of the invention is to provide improved relief structures or protective layers on semiconductors, such structures having at least one contact opening.

BRIEF DESCRIPTION OF THE INVENTION

According to the present invention passivating heat-resistant layers having at least one contact opening therein can be applied to semiconductor substrates, thereby forming a novel relief structure, by applying to a suitable substrate a film or foil of a soluble pre-polymer capable of undergoing further cross-linking and curing comprising a poly-addition or poly-condensation product of a polyfunctional carbocyclic and/or heterocyclic compound which contains (a) at least two chemical groups suitable for addition or condensation reactions and (b) an organic photo-or radiation-reactive group R* bound to a carboxyl group in ester fashion in a position ortho or para to the group (a) where R* defines an organic residue with photo- or radiation-induced di-or polymerizable olefinic double bonds, exposing or irradiating the photo-reactive or radiation-reactive film or foil through negative originals, dissolving out or stripping the unexposed or non-irradiated parts and, optionally, tempering the reliefs obtained. In this manner novel relief structures may be created wherein selected openings in the passivating layer provide positions for contact points as hereinafter described with reference to the drawings.

The polymeric resins suitable for the passivating layer are those described in co-pending application Ser. No. 444,552, filed Feb. 21, 1974 to which reference is made and whose disclosure is incorporated herein by reference. In particular, for the preparation of relief structures according to the invention, polymers of the following classes of substances are particularly well suited:

Polyisoindolquinazolindiones;
Polyimides, polyamidimides and polyester imides;
Poly-1,3-oxazine-6-ones;
Poly-1,3-quinazoline-2,6-diones; and
Polybenz-1,3-oxazindiones-2,4.

These are examples of highly temperature-resistant polymers which can be prepared according to the invention via photo-interlinkable, soluble intermediate stages.

The primary soluble pre-polymers obtained through poly-condensation contain photo- or radiation-reactive organic groups R* which are bound to carboxyl functions in ester fashion and can dimerize or homo- or co-polymerize upon exposure to high-energy light or other radiation, possibly splitting off fragments, and thus cause insolubility, depending on the cross-linkage. Ultra-violet light is preferred, but irradiation with ionizing radiation, x-rays or accelerated electrons is also possible. Further hardening of the insoluble protective layer may be obtained through heat curing, if desired. It is preferred to use a polyamide resin as the soluble pre-polymer.

R*, as used herein, is defined as an organic residue with a photo- or radiation-induced dimerizable or polymerizable multiple bond, preferably an definically-unsaturated double bond.

The soluble polymers comprise carbocyclic and/or hetero-cyclic moieties which are linked together with amide

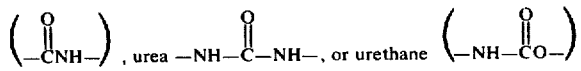

linkages and which, in ortho- or peri-position relative to the amide, urea, urethane linkages, contain organic photo- or radiation-reactive R* groups. The polymers, which can be cyclized to form new heterocyclic chain links by splitting off the photo- or radiation-reactive R* upon heating, are exposed or irradiated through a pattern, preferably a negative pattern, in the form of films on a substrate or in the form of foil. The exposure is preferably made with ultraviolet light. The unexposed or unirradiated portions are subsequently dissolved or stripped off to leave highly heat-resistant relief structures remaining. In a further embodiment of the method, the relief structures obtained are subsequently annealed. In this process, the bonds from the polymer chains to the photo-or radiation crosslinkable and photo- or radiation crosslinked groups are ruptured, and through cyclizing, ladder or step-ladder polymers with heterocyclic chain links exhibiting highly heat-resistant properties are produced to an increased degree.

To prepare the soluble prepolymers used according to the invention, which are stable for storage at room temperature, a tri- or tetrafunctional compound designated as a First Ring Compound is poly-added or poly-condensed with a Second Ring Compound. The First Ring Compound is an at least partially cyclic structure which contains (a) two chemical functions capable of condensation or addition reactions, and (b) one to two further unsaturated carboxylic-acid ester functions in ortho- or peri-position thereto. The Second Ring Compound is an at least partially cyclically structured, di- or tetrafunctional compound which contains, besides the two chemical functions (a) capable of poly-condensation or poly-addition reactions, two further chemical functions in ortho- or peri-position which participate during the annealing in a subsequent cyclizing reaction, which proceeds under separation of R*OH.

Examples of suitable combinations of chemical functions capable of condensation or addition are given in the following schematic tabulation:

| Case No. | Chemical Functions | First Ring Compound | | Second Ring Compound |
|---|---|---|---|---|
| 1) | a | —COCl | a | —NH$_2$ |
|  |  | —COCl |  | —NH$_2$ |
|  | b | —COOR* | — | — |
|  |  | (—COOR*) |  |  |
| 2) | a | —COOH | a | —NCO |
|  |  | —COOH |  | —NCO |
|  | b | —COOR* | — | — |
|  |  | (—COOR*) |  |  |
| 3) | a | —NH$_2$ | a | —COCl |
|  |  | —NH$_2$ |  | —COCl |
|  | b | —COOR* | — | — |
|  |  | (—COOR*) |  |  |
| 4) | a | —NCO | a | —COOH |
|  |  | —NCO |  | —COOH |
|  | b | —COOR* | — | — |
|  |  | (—COOR*) |  |  |
| 5) | a | —NH$_2$ | a | —NCO |
|  |  | —NH$_2$ |  | —NCO |
|  | b | —COOR* | — | — |
|  |  | (—COOR*) |  |  |
| 6) | a | —OH | a | —NCO |
|  |  | —OH |  | —NCO |
|  | b | —COOR* | — | — |
|  |  | (—COOR*) |  |  |

( ) indicates the functional group is optional.

In Case 1, the First Ring Compound is a bis-acid chloride containing one or two R* ester groups while the Second Ring Compound is a diamine. Alternatively, the First Ring Compound can be a diamine and the Second Ring Compound can be a bis-acid chloride (Case No. 3). In Case No. 2, the First Ring Compound is a diacid having one or two R* ester groups, while the Second Ring Compound is a diisocyanate, while in Case No. 4 the carboxyl and isocyanate groups are exchanged. Cases No. 5 and No. 6 are similar to Case No. 2 except that the carboxyl groups of the First Ring Compound of Case No. 2 are replaced by amino groups (Case No. 5), or hydroxyl groups (Case No. 6).

The primary soluble prepolymers obtained through poly-condensation contain photo- or radiation-reactive organic groups R* which are bound to carboxyl functions in ester-fashion and can dimerize or homo- or co-polymerize upon exposure to high-energy light or other radiation, possibly splitting off fragments, and thus cause insolubility, depending on the cross-linkage. Ultra-violet light is preferred, but irradiation with ionizing radiation, X-rays or accelerated electrons is also possible.

As noted previously, the First Ring Compound is a cyclic structure having two functional groups capable of forming amide, urea or urethane linkages and at least one R* group bonded to the compound through an ester linkage. These compounds may be represented by the formula:

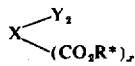

wherein X is a carbocyclic and/or heterocyclic nucleus, Y is a condensable functional group such as carboxyl, carbonyl chloride, amine, isocyanate or hydroxyl; R*$_x$ is as defined above; and x is 1 or 2.

These compounds are readily derived from known starting materials. For example, pyromellitic anhydride is a convenient starting material for compounds wherein Y is carboxyl or carbonyl-chloride. Still other starting materials will be apparent to those of ordinary skill in the art.

The —CO$_2$R* radical is formed by conventional esterification techniques, as by reaction of an aromatic acid, acid anhydride or acid chloride with an alcohol of the formula R*OH.

X is preferably an aromatic residue such as a benzene residue, a pyridine residue or a residue of a biphenyl compound of the formula:

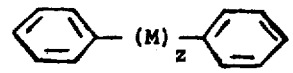

where M is O, CH$_2$ or SO$_2$ and z is 0 or 1. When X is a benzene residue, preferred compounds are those of the formula:

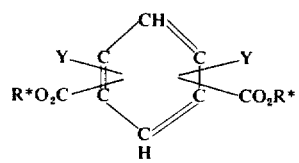

wherein Y and R* are as defined above. When an X is a biphenyl residue, preferred compounds are those of the formula:

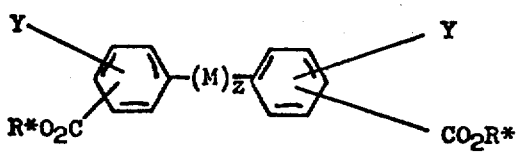

wherein Y and R* are as defined above and Y and R* are on adjacent carbons.

Suitable residues R* are known photo- or radiation-reactive organic groups, which, if necessary, with stabilization, are stable in the absence of light under the applicable preparation conditions for the poly-functional starting compounds, the poly-condensation or poly-addition conditions and under storage at room temperature. Suitable alcoholic or phenolic, photo- or radiation reactive starting compounds R*HO for the esterification are, for instance:

HO — CH$_2$CH=CH$_2$

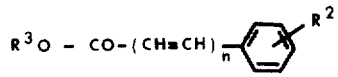

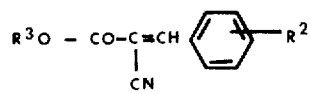

and

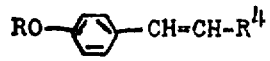

wherein in the above formulas:
R is hydrogen or hydroxyalkyl;
$R^1$ is alkyl, phenyl, alkoxyphenyl or halophenyl;
$R^2$ is hydrogen, chlorine, alkyl or alkoxy;
$R^3$ is hydroxyalkyl;
$R^4$ is a carbocyclic or heterocyclic residue bonded through a ring carbon; and
n is 1 or 2.

R* preferably is allyl or a radical containing, the cinnamoyl moiety, with allyl being especially preferred.

The alkyl and alkoxy groups preferably are linear or branched chain alkyl or alkoxy groups from 1 to about 6 carbons, especially methyl, ethyl and propyl, and the corresponding alkoxy groups. Hydroxyalkyl groups comprehend hydroxy-substituted linear or branched alkyl groups of 2 to 6 carbons, especially hydroxyethyl and hydroxy propyl. Halogen substituents include chlorine, bromine or iodine, with chlorine being preferred. Carbocyclic residues comprise phenyl, biphenyl, naphthyl and the like, which may be substituted with alkyl, halogen, or other inert substituents. Heterocyclic residues are those corresponding to the aromatic residues, wherein one or more carbons is replaced by nitrogen, including residues of pyridine, quinoline, pyrimidine and the like. Preferred prepolymers are prepared from a First Ring Compound comprising a tetrafunctional benzene compounds having two unsaturated ester substituents and either two carboxylic acid, two carboxylic acid chloride or two hydroxyl substituents.

The Second Ring Compound is a polyfunctional, i.e., di- or tetrafunctional compound having two functional groups capable in the condensation with the condensable functional groups of the First Ring Compound to form amide, urea or urethane linkages. The Second Ring Compound also may have two functional groups which, upon heating of the polymer of this invention to liberate R*OH, react with the carbonyl group formerly attached to OR* to form a cyclic structure. The Second Ring Compound may be represented by the formula:

where D is a carbocyclic or hetero-cyclic nucleus; E is a condensable group capable of forming amide, urea or urethane linkages, F is a group capable of reacting with carbonyl formed upon releasing R*OH on heating; and y is 0 or 2. Preferred compounds are those wherein y is 0; D is phenylene, a pyridinylene or a diphenyl group of the formula

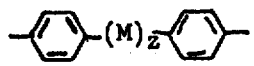

where M is O, $SO_2$ or $CH_2$; z is 0 or 1; and E is carboxyl, carbonyl chloride, amino or isocyanate.

The prepolymers are obtained by condensation polymerization of the First and Second Ring Compounds to afford linear polyamides, polyurea or polyurethanes. The conditions for effecting such reactions are well-known, and will not be further detailed here. Suffice it to say that suitable prepolymers have been obtained by reacting approximately equi-molar quantities of a First Ring Compound with a Second Ring Compound in a suitable solvent at temperatures sufficient to effect the polycondensation. Highly elevated temperatures sufficient to cause scission of the OR* group or vinyl polymerization should be avoided.

The resulting prepolymer is a substantially linear polyamide, polyurea or polyurethane comprised of cyclic nuclei bonded to each other through amide, urea or urethane linkages and having pendant $—CO_2R*$ substituents. The prepolymers have repeating units of the formula:

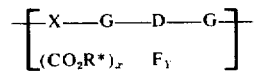

wherein X, D, F, R*, x and y are as previously defined and G is an amide, urea or urethane linkage formed by reaction of the functional groups defined by Y and E above.

The resulting linear condensation prepolymer is then formed into a film or foil by applying a solution of the prepolymer to a substrate and evaporating off the solvent. The dried film or foil is then subjected to imagewise radiation with light or other forms of radiation to effect cross-linking through the pendant R* groups. In order to increase the speed of cross-linking during Step 2, commonly used photo-initiators and/or sensitizers can be employed; see Industrie Chimique Belge vol. 24, p. 739 to 64 (1959) or Light-sensitive Systems by J. Kosar, John Wiley & Sons, Inc., New York 1965, p. 143 to 146 and 160 to 188. The soluble polymer chains can furthermore be combined for this purpose with other light- or radiation-sensitive compounds capable of co-polymerization. The interlinkage caused by exposure to light or radiation can optionally be supplemented by annealing at temperatures, at which no purely thermal interlinking or cyclization takes place yet.

The protective layer according to the invention advantageously has greater bond strength than the known polyimide resin layers. Also, according to the invention, it is possible to obtain high cross-linking rates with the protective layers by exposing them, even with fairly considerable layer thicknesses, for example layer thicknesses of greater than 10 $\mu$.

Further particulars of the invention and its configurations are given in the following description and accompanying drawings of one preferred embodiment of the invention and its further developments.

Figure 2:
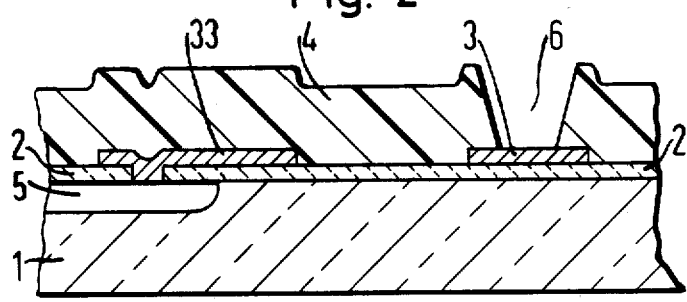
Figure 3:
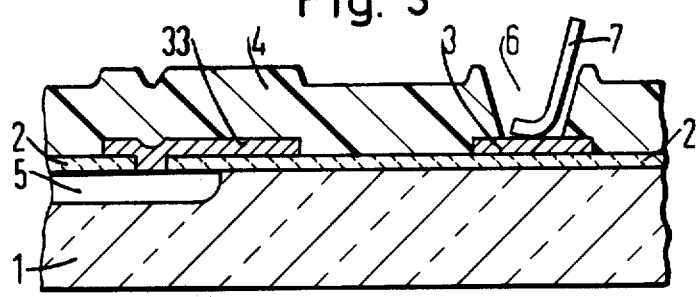

FIGS. 1 to 3 diagrammatically illustrate the process according to the invention for applying a protective layer to a semiconductor component.

Figure 4:
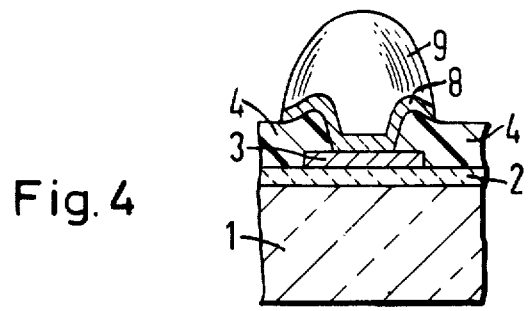

FIG. 4 diagrammatically illustrates a solderable connecting bump for flip-chip contacting.

Figure 5:
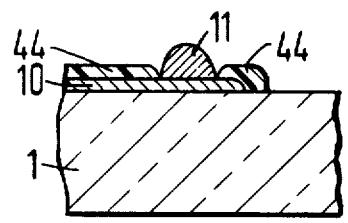

FIG. 5 diagrammatically illustrates the use of a layer produced by the process according to the invention as a solder dam.

Figure 6:
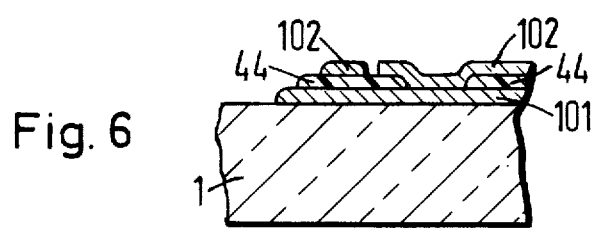

FIG. 6 diagrammatically illustrates the use of a protective layer obtained by the process according to the invention as an insulating layer at conductor crossovers.

Figure 7:
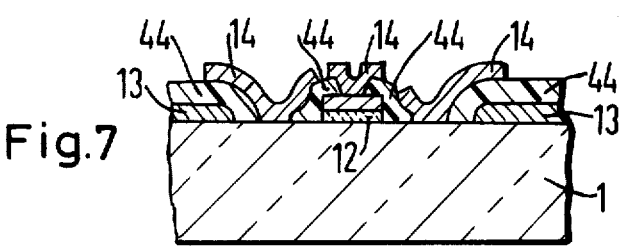

FIG. 7 diagrammatically illustrates the use of a protective layer obtained by the process according to the invention as an insulating or passivating layer under Al-conductor tracks.

Figure 8:
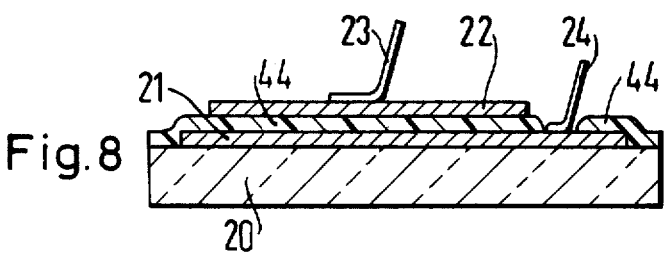

FIG. 8 diagrammatically illustrates a thin-layer capacitor with a protective layer obtained by the process according to the invention.

Referring more particularly to FIG. 1, this figure illustrates a semiconductor component to whose surface a protective layer 4 according to the invention is applied. For example, the semiconductor component consists of a semiconductor substrate 1 to which an SiO$_2$-layer 2 is applied. For example, a zone 5 has diffused into the semiconductor zone 1, being electrically connected to an aluminum conductor track 33 through an opening in the SiO$_2$ insulating layer. In addition, the aluminum conductor track 3 is applied to the insulating layer 2, also being electrically connected to a diffused zone (not shown). The aluminium conductor track 3 is insulated from the semiconductor 1 by the insulating layer 2. After tempering, preferably at 450°C, in forming gas consisting, for example, of nitrogen (90 precent) and hydrogen (10 percent), the protective layer 4 according to the invention is applied to the semiconductor component described above, initially in the form of a soluble polymeric preliminary stage.

As stated in application Ser. No. 444,552, the soluble polymeric preliminary stages used are poly-addition products or poly-condensation products of polyfunctional carbocyclic and/or heterocyclic compounds which contain at least two chemical groups suitable for addition or condensation reactions and organic photoreactive or radiation-reactive groups R* (R* being an organic radical with multiple bonds capable of being dimerized or polymerized by photoinduction or radiation induction) which are at least partly attached in the manner of esters to carboxyl groups in the ortho or para position to the aforementioned chemical groups.

In order to apply this preliminary stage, the semiconductor disc is preferably placed on the spinplate of a centrifuge of the kind normally used for photoresist coating, covered with a few drops of the photo- or radiation-cross-linkable resin and centrifuged at preferably around 2000 revolutions per minute. The resin film formed in this way on the surface of the semiconductor component is about 2 to 4 μ thick.

Subsequently, the semiconductor component with the protective layer 4 on it is dried at about 100°C and subsequently exposed, preferably to ultraviolet light, through a negative original (photomask). As a result, the exposed parts of the resin layer 4 cross-link under the effect of the light and cannot be dissolved by the developer. As alcoholic dimethylformamide solution is preferably used as the developer. By contrast, the unexposed parts of the resin layer are dissolved away by the developer. In this way, openings are formed at the required places, especially at the connecting spots for the contacts, for example as designated by the reference 6 above the aluminium conductor track 3 in FIG. 2.

The protective layer is then cured in another process stage. In this way, the protective layer is made very resistant. Appropriate curing conditions for specific irradiated pre-polymer coatings are well-known to persons versed in the art. For example, in the case of a polyamide, it is preferably cured for about 30 minutes at around 350°C.

As shown in FIG. 3, the exposed connecting spots on the conductor 3 can then be contacted, as, for example, by a wire 7.

In FIG. 4, a bump contact 9 is arranged in the opening 6, being suitable for flip-chip contacting. Contacting can also be carried out in the form of beam-lead contacting.

FIG. 5 illustrates another embodiment wherein the protective layer provides a solder dam. The drop of solder 11, which is applied to a thick film or thin film conductor track 10, for example by dipping into a solder bath, is defined by the opening in the protective layer 44 according to the invention. The drop of solder consists for example of a soft solder with a melting point of around 330°C. In its cured form, the protective layer according to the invention can be briefly heated up to 500°C without damage. Accordingly, it is resistant to solder.

FIG. 6 illustrates the use of a protective layer according to the invention as an insulating layer at conductor crossovers. A thick film or a thin film conductor track 101 is applied in a first plane to a substrate 1 which can consist, for example, of ceramic or of an oxidized silicon substrate. This conductor track 101 has applied to it the protective layer 44 according to the invention in which an opening is formed for establishing contact with the thick film or thin film conductor track of the first plane. Another thick film or another thin film conductor track 102 is then applied in a second plane to the protective layer 44 according to the invention. The conductor track of the second plane is insulated from the conductor track of the first plane by the protective layer.

A protective layer according to the invention can also be used as a gate insulator in MOS-components.

FIG. 7 illustrates the use of a protective layer 44 according to the invention as an insulating or passivating layer under aluminium conductor tracks 14. A layer of this kind can be used for example as an insulating layer between the poly-silicon-conductor tracks 12 and the metallic conductor tracks 14 of silicon gate devices.

FIG. 8 illustrates a thin layer capacitor with a passivating protective layer 44 produced in accordance with the invention. A metal layer 21 is applied to a substrate 20 which preferably consists of glass. This metal layer 21 represents one of the electrodes of the capacitor and preferably consists of aluminium. The passivating protective layer 44 is applied to the metal layer 21, whilst the metal layer 22 is applied to the passivating protective layer. The metal layer 22 represents the other electrode of the thin layer capacitor. The protective layer 44 acts as the dielectric of the capacitor. The contact 24 is situated in an opening in the protective layer 44 establishing an electrical connection with the metal layer 21. Contact of the metal layer 22 is denoted by the reference 23.

What is claimed is:

1. A semiconductor component having a polymeric heat-resistant relief structure thereon, comprising a semiconductor substrate, an insulating layer at least partially covering said substrate, a conductor component layer at least partially covering said insulating layer, a layer of a polymer covering said substrate and said conductor component, said polymer being derived from a soluble pre-polymer, said prepolymer having repeating units of the formula:

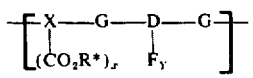

wherein, X and D each comprise a carbocyclic and/or heterocyclic nucleus;

G is selected from the group consisting of amide urea or urethane linkages;

R* is an organic radical containing a photo- or radiation induced di- or polymerizable olefinic double bond; and is a component of ester group $CO_2R^*$, said group bound to said nucleus in ortho or peri position to G;

F is a group capable of reacting with the carbonyl group of $CO_2R^*$ to form a cyclic structure upon heating of the prepolymer to liberate R*OH; and wherein F is arranged in ortho- or peri- position to G;

$x$ is 1 or 2; and $y$ is 0 or 2;

said pre-polymer having been cross-linked through exposure or irradiation of the photo- or radiation-reactive groups, said layer having at least one contact opening therein formed by dissolving the non-exposed or non-irradiated portions of said pre-polymer, with a solvent and a conductive element contacting said conductive layer in said opening.

2. The semiconductor of claim 1 wherein the contact element is in the form of a bump contact for flip-chip contacting.

3. The semiconductor of claim 1 wherein the contact element is in the form of a solder bump having a melting point below that of the polymer.

4. The semiconductor of claim 1 wherein the contact element is in the form of a beam-lead.

5. The semiconductor of claim 1 wherein the polymer forms a protective layer between underlying and overlying conductor cross-overs, said at least one opening providing contact between the conductors.

6. The semiconductor of claim 1 wherein the polymer film or foil forms a passivating layer under aluminium conductor tracks, said aluminium conductor tracks having contact with said semiconductor substrate through said at least one opening.

7. A capacitor comprising a substrate, a first metallic conductor layer on said substrate, a protective passivating layer at least partially overlying said first metallic conductor layer, and a second metallic layer at least partially overlying said protective passivating layer, a first contact means attached to said first metallic layer through an opening in said passivating layer, and a second contact means attached to said second metallic layer, said passivating layer being comprised of a poly-addition or poly-condensation product having repeating units of the formula:

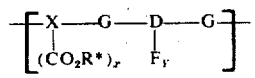

wherein, X and D each comprise a carbocyclic and/or heterocyclic nucleus;

G is selected from the group consisting of amide urea or urethane linkages;

R* is an organic radical containing a photo- or radiation induced di- or polymerizable olefinic double bond;

and is a component of ester group $CO_2R^*$, said group bound to said nucleus in ortho or peri position to G;

F is a group capable of reacting with the carbonyl group of $CO_2R^*$ to form a cyclic structure upon heating of the prepolymer to liberate R*OH; and wherein F is arranged in ortho- or peri-position to G;

$x$ is 1 or 2; and $y$ is 0 or 2;

which product has been cross-linked by exposure or irradiation of the photo- or radiation-reactive groups wherein the opening in said passivating layer is formed by dissolving the non-exposed or non-irradiated portion of said pre-polymer with a solvent.

* * * * *